United States Patent [19]
Hara

[11] Patent Number: 5,991,205
[45] Date of Patent: Nov. 23, 1999

[54] METHOD OF ERASING DATA IN NONVOLATILE SEMICONDUCTOR MEMORY DEVICES

[75] Inventor: Hideki Hara, Tokyo, Japan

[73] Assignee: NEC Corporation, Tokyo, Japan

[21] Appl. No.: 09/153,610

[22] Filed: Sep. 15, 1998

[30] Foreign Application Priority Data

Oct. 24, 1997 [JP] Japan ..................................... 9-291888

[51] Int. Cl.⁶ .................................................. G11C 16/00
[52] U.S. Cl. ............................... 365/185.29; 365/185.18; 365/185.27; 365/218
[58] Field of Search ............................. 365/185.29, 218, 365/185.18, 185.26, 185.27

[56] References Cited

U.S. PATENT DOCUMENTS

| | | | |
|---|---|---|---|
| 5,077,691 | 12/1991 | Haddad et al. .......................... | 365/218 |
| 5,438,542 | 8/1995 | Atsumi et al. .................. | 365/185.27 X |
| 5,521,866 | 5/1996 | Akaogi ................. | 365/185.29 |
| 5,770,963 | 6/1998 | Akaogi et al. ................. | 365/185.29 X |
| 5,790,460 | 8/1998 | Chen et al. .......................... | 365/185.29 |
| 5,818,756 | 10/1998 | Sakui et al. ..................... | 365/185.29 X |
| 5,838,618 | 11/1998 | Lee et al. ............................ | 365/185.29 |

*Primary Examiner*—Do Hyun Yoo
*Attorney, Agent, or Firm*—McGinn & Gibb, P.C.

[57] ABSTRACT

In a data erase operation of the present invention, a drain terminal is opened. A negative voltage of about −10 V and a voltage of about 5 V are applied to a cell gate and a source terminal, respectively. The voltage of about 1–2 V is applied to a P well terminal and an N well terminal. A ground potential is provided to a substrate. A voltage which is lower than the voltage of the source terminal and higher than the substrate voltage (ground voltage) is applied to a P well and an N well between a source diffusion layer and the substrate. Thus, an electric field generated between a source and a floating gate realizes the erase by means of F-N tunneling.

8 Claims, 3 Drawing Sheets

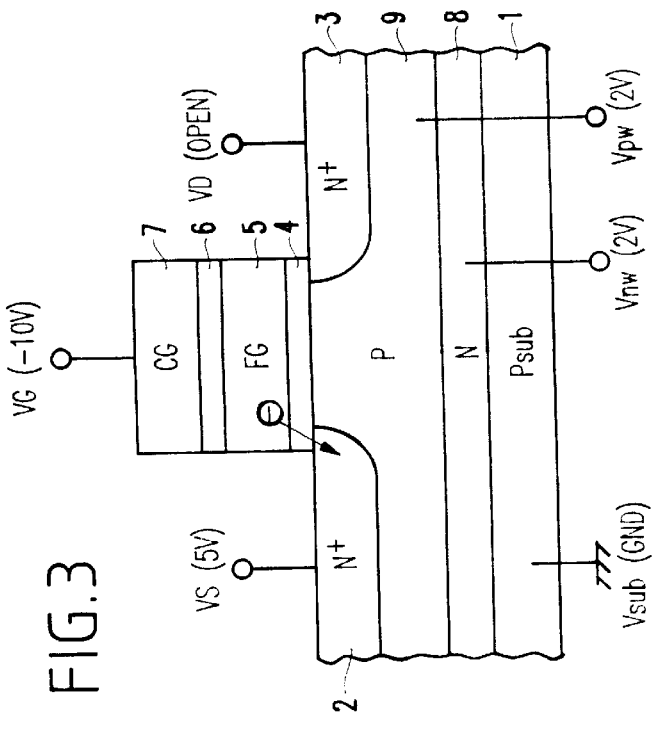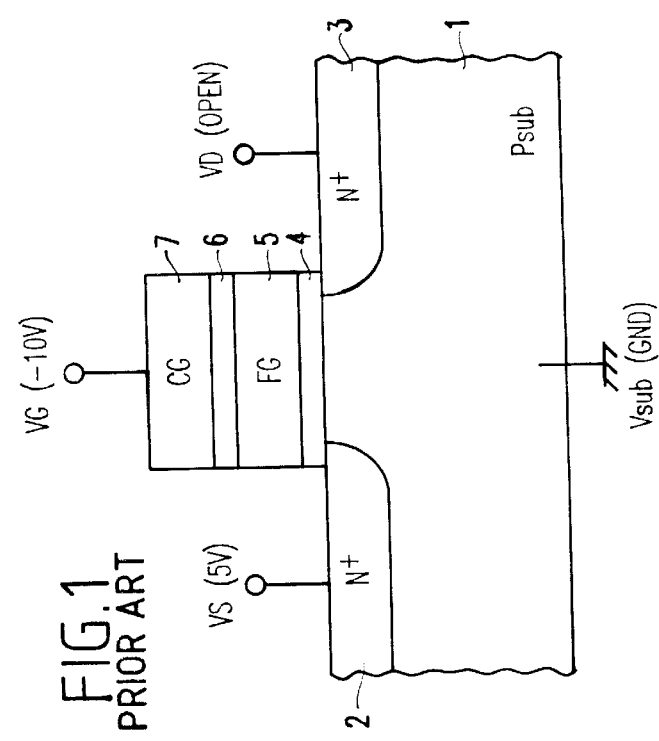

METHOD OF ERASING DATA IN NONVOLATILE SEMICONDUCTOR MEMORY DEVICES

BACKGROUND OF THE INVENTION

1. Field of the Invention

The present invention relates to a method of erasing information (data) stored in nonvolatile semiconductor memory devices, more particularly, nonvolatile semiconductor memory devices such as EEPROM including a floating gate.

2. Description of the Related Art

A nonvolatile semiconductor memory device is a semiconductor memory in which written data is not lost even when a power source is turned off. This memory has been heretofore diversely researched and developed. Since EPROM (Electrically Programmable Read Only Memory) and a flash memory have a memory cell structure advantageous for a fine formation, they are suitable for high integration of a device. More specifically, since a flash memory can electrically write and erase data, it is receiving attention as a means of replacement of magnetic media, etc. For writing the data onto this flash memory, a channel hot electron method or F-N (Fowler-Nordheim) tunneling is used so as to inject electrons in a floating gate. On the other hand, a known method of erasing the data is drawing out of electrons out from the floating gate by F-N tunnel phenomenon occurring between a source and the floating gate.

Such data erasing methods include a so-called source high voltage erasing method. In this method, a high voltage (for example, 12 V) is applied to a cell source constituting a cell and having MOS structure and then a cell gate (control gate) is grounded, whereby a high electric field is generated between the source and the floating gate, so that the F-N tunnel tunneling is produced. For this method, it is necessary to form a source-side diffusion layer having a high voltage-resistant structure. Thus, this method has a problem, i.e., a difficulty in finely forming the cell.

An erasing method has therefore been proposed in which a source potential is reduced. FIG. 1 shows a technique disclosed in U.S. Pat. No. 5,077,691. In this drawing, the memory cell has the structure described below. An N-type impurity diffusion layer, namely, source 2 and drain 3 are formed on P-type silicon substrate 1. Floating gate 5 is also formed on P-type silicon substrate 1 between the source and the drain through gate oxide film 4. Control gate (cell gate) 7 is further formed on floating gate 5 through inter-gate oxide film 6. Source diffusion layer 2, drain diffusion layer 3, cell gate 7 and P-type silicon substrate 1 are connected to voltage terminals VS, VD, VG and Vsub, respectively.

For this flash memory cell, a voltage of about 5 V and a negative voltage of about −10 V are applied to VS and VG, respectively. A high electric field is thus generated between the source and the floating gate. Consequently, erasing is realized by means of the F-N tunnel tunneling. FIG. 2 is a table showing an operating voltage in this case. In this erasing method, compared to the above-described source high voltage erasing method, the high voltage is not applied to a source terminal. Thus, the source-side diffusion layer does not need the high voltage-resistant structure. Therefore, a fine cell is easily formed. It is also said that this method can reduce the generation of holes having high energy due to inter-band tunneling and can improve the reliability of the gate oxide film under the floating gate.

This improved erasing method is effective for the formation of a fine cell, because a source voltage is reduced. However, the electric field is high between the source and the floating gate. Thus, when many electrons are stored in the floating gate (i.e., when the data is written), a silicon band is considerably curved on the surface of the source diffusion layer near a channel and thus an inter-band tunneling current may be increased. As a result, it is difficult to completely prevent the deterioration of quality of the gate oxide film under the floating gate. In this case, the following solution is suggested. That is, for the purpose of reducing the inter-band tunneling current, the source diffusion layer is constituted of a graded junction in order to relax the electric field between the source-side diffusion layer and the substrate. However, in this solution, the area of the source diffusion layer is increased. Thus, this solution has the difficulty in achieving an original object, namely, in forming a fine cell.

SUMMARY OF THE INVENTION

It is an object of the present invention to provide a method of erasing data in a nonvolatile semiconductor memory device which can form a fine cell by reducing a minute inter-band tunneling current generated during erasing and by preventing a hot carrier generated due to this inter-band tunneling current from deteriorating a gate oxide film under a floating gate.

According to one aspect of the present invention, there is provided a method of erasing data in a nonvolatile semiconductor memory having a second conductive type source region and a second conductive type drain region on a first conductive type semiconductor substrate, having a floating gate on the first conductive type semiconductor substrate between the source region and the drain region through a first insulating film, and having a control gate on the floating gate through a second insulating film, the method comprising the steps of: providing a predetermined potential having a polarity to a ground potential to the source region; providing a high potential having a polarity reverse to the ground potential to the control gate; and providing a potential intermediate between the ground potential and the predetermined potential having a polarity to the first conductive type semiconductor substrate.

According to another aspect of the present invention, there is provided a method of erasing data in a nonvolatile semiconductor memory having a second conductive type well region on a first conductive type semiconductor substrate, having a first conductive type well region in the second conductive type well region, having a second conductive type source region and a second conductive type drain region in the first conductive type well region, having a floating gate on the first conductive type well region between the source region and the drain region through a first insulating film, and having a control gate on the floating gate through a second insulating film, the method comprising the steps of: providing a predetermined potential having a polarity to a ground potential to the source region; providing a high potential having a polarity reverse to the ground potential to the control gate; providing the ground potential to the first conductive type semiconductor substrate; and providing a potential intermediate between the ground potential and the predetermined potential having a polarity to the second conductive type well and the first conductive type well.

In the data erasing method of the present invention, the inter-band tunneling current can be reduced on the surface of a source diffusion layer near a channel. Less hot carrier due to the inter-band tunneling current is generated. It is therefore possible to prevent the deterioration of the gate oxide film under the floating gate. Moreover, for reducing the inter-band tunneling current, a source junction does not have to be a graded junction. Thus, the cell can be finely formed.

BRIEF DESCRIPTION OF THE DRAWINGS

For a more complete understanding of the present invention and the advantages thereof, reference is now made to the following description taken in conjunction with the accompanying drawings, in which;

FIG. 1 is a schematic cross sectional view of a flash memory for describing a conventional erasing method;

FIG. 2 shows a voltage applied to each portion in the data erasing method of FIG. 1;

FIG. 3 is a schematic cross sectional view of the flash memory which the present invention is applied to;

FIG. 4 shows the voltage applied to each portion in first and second embodiments of the present invention;

FIG. 7 is a schematic cross sectional view of another constitution of the flash memory which the present invention is applied to.

DETAILED DESCRIPTION OF THE PREFERRED EMBODIMENTS

Figure 5:
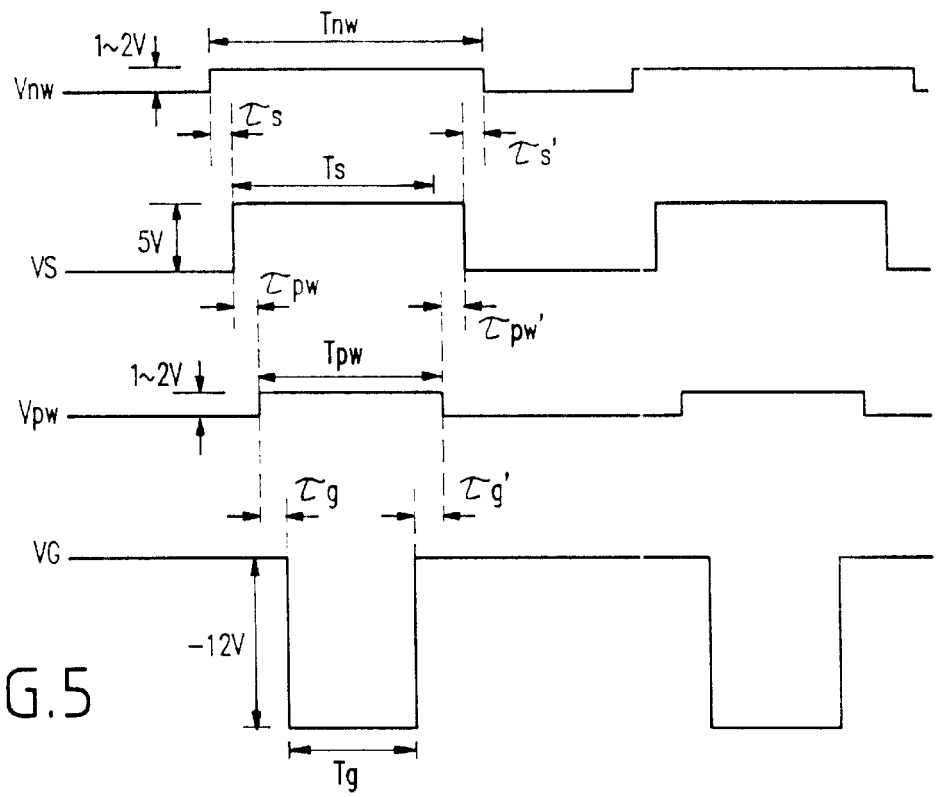
FIG. 5 is a timing chart of the applied voltages in the first embodiment of the present invention.

Embodiments of the present invention will be described below with reference to the accompanying drawings. FIG. 3 is a cross sectional view of a cell showing a voltage during erasing for describing an erasing method of the present invention. In this drawing, N well 8 is formed on P-type silicon substrate 1 and P well 9 is also formed in this N well 8. Source diffusion layer 2 and drain diffusion layer 3 composed of an N-type impurity diffusion layer are formed in P well 9 on P-type silicon substrate 1. Floating gate 5 composed of a polysilicon film of about 1000–2000 Å thick is formed on P well 9 between source diffusion layer 2 and drain diffusion layer 3 through gate oxide film 4 of about 100 Å thick. Control gate 7 is also formed on floating gate 5 through inter-gate oxide film 6 composed of the oxide film having a film thickness of about 150–250 Å or the multilayer structure of oxide film/nitride film/oxide film.

Operations for reading, writing and erasing data in the cell having the above-mentioned constitution will be described below. FIG. 4 is a table showing source voltage VS, drain voltage VD, gate voltage VG, P well voltage Vpw, N well voltage Vnw and silicon substrate voltage Vsub in the operations. In the data read operation, a voltage of about 1 V and a voltage of about 5 V are applied to a drain terminal and a cell gate, respectively. At this time, a ground potential is provided to a source terminal, a P well terminal, an N well terminal and the substrate. When electrons are not stored in floating gate 5, that is, when the data is erased, a threshold voltage of the cell is as low as about 2 V and thus a drain current flows. This drain current is sensed by a sense amplifier connected to a digit line so as to determine that the data is "0". When electrons are stored in floating gate 5, that is, when the data is written, the threshold voltage of the cell is as high as about 8 V and thus the drain current does not flow. As a result, a determination is made that the data is "1".

In the data write operation, a voltage of about 5 V and a voltage of about 10 V are applied to the drain terminal and the cell gate, respectively. The ground potential is provided to the source terminal, the P well terminal, the N well terminal and the substrate. Under this voltage condition, the electrons flowing through a channel get hot. The electrons pass through a potential barrier of gate oxide film 4. The electrons are then injected into floating gate 5. Thus, the threshold voltage of the cell is increased, so that the data is written.

In the data erase operation which is characteristic of the present invention, the drain terminal is opened. A negative voltage of about −10 V and a voltage of about 5 V are applied to the cell gate and the source terminal, respectively. The voltage of about 1–2 V is applied to the P well terminal and the N well terminal. The ground potential is provided to the substrate. That is, the voltages are applied to the cell gate and the source terminal in the same manner as the technique disclosed in the above-described U.S. patent. However, herein, the voltage which is lower than the voltage of the source terminal and higher than the substrate voltage (ground voltage) is applied to P well 9 and N well 8 between source diffusion layer 2 and substrate 1. Thus, an electric field is generated between the source and the floating gate, whereby the erase is accomplished by means of F-N tunneling.

In such an erasing method, the voltage applied to P well 9 and N well 8 allows a potential difference to be reduced between source diffusion layer 2 and the substrate, i.e., a semiconductor layer, that is, between source 2 and P well 9. Thus, the electric field is weakened on the surface near the source-side channel, and an inter-band tunneling current can be reduced. This can prevent the deterioration of gate oxide film 4 under floating gate 5 due to a hot hole generated by the inter-band tunneling current and also can improve the reliability. For the purpose of reducing the inter-band tunneling current, source diffusion layer 2 does not need to be constituted of a graded junction in order to relax the electric field between source diffusion layer 2 and substrate 1. Drain diffusion layer 3 and source diffusion layer 2 can be thus symmetrically designed, so that a fine cell is easily formed in a longitudinal direction of the channel. Furthermore, an electron emission from the floating gate to the source diffusion layer due to the F-N tunneling depends on the electric field in an overlap region in which the source diffusion layer and the floating gate overlap each other. Thus, the electron emission is slightly influenced by the P well voltage. However, an F-N tunneling speed, namely, an erase speed is not influenced very much.

FIG. 5 is a timing chart of the application of the voltages during erasing, namely, the application of source voltage VS, P well voltage Vpw, N well voltage Vnw, substrate voltage Vsub and cell gate voltage VG. First, voltage Vnw of about 1 V is applied to the N well. Then, voltage VS of about 5 V is applied to the source after a certain time interval ts in consideration of the leading edge of an N well potential depending on an N well capacity. Next, voltage Vpw of about 1 V is applied to the P well after a certain time interval tpw. Then, negative voltage VG of about −10 V is applied to the cell gate after a certain time interval tg in consideration of the leading edge of a P well potential depending on a P well capacity. In this state, the data is erased by the F-N tunneling in the overlap in which the source diffusion layer and the floating gate overlap each other. The trailing edges are provided to these potentials in the reverse order to the above-described leading edges shown in FIG. 5.

Figure 6:
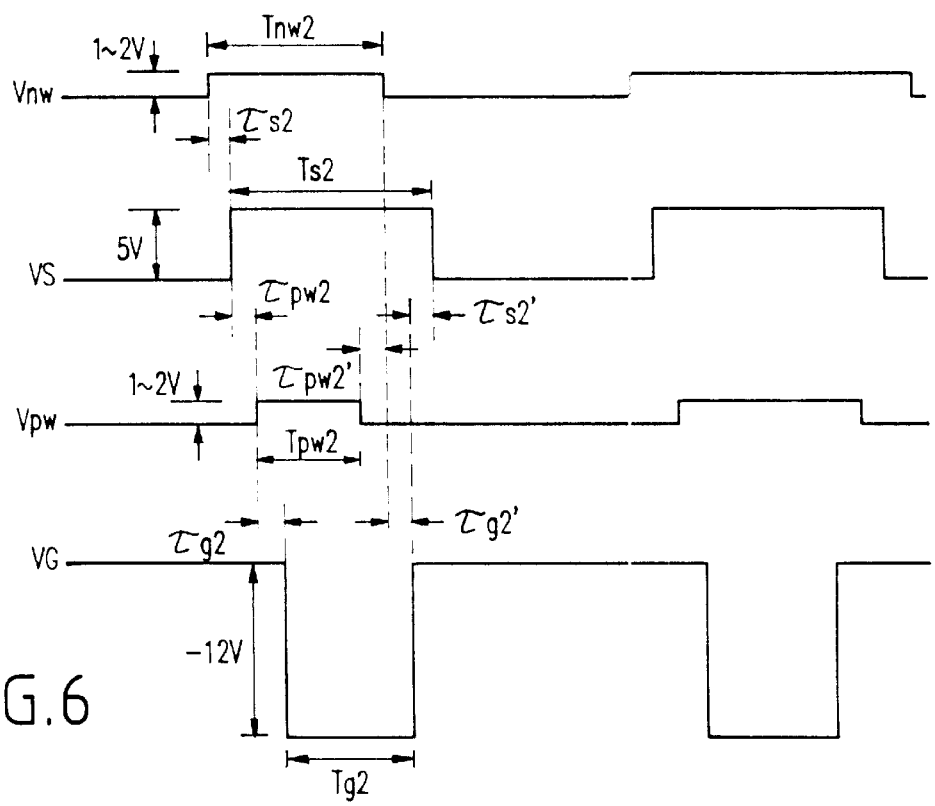
FIG. 6 is a timing chart of the applied voltages in the second embodiment of the present invention.

The timing of the application of the above-mentioned voltages can be also controlled as shown in FIG. 6. This second embodiment is characterized by that the trailing edge of P well voltage Vpw is provided before the trailing edge of cell gate voltage VG. That is, the second embodiment has the same timing of the leading edge during erasing as the first embodiment, and thus the description is omitted. On the other hand, the trailing edge of the voltage is as follows. First, during the application of source voltage VS and cell gate voltage VG, the trailing edge is provided to P well voltage Vpw. Next, the trailing edge is provided to N well voltage Vnw. Then, the trailing edge is provided to cell gate voltage VG after a certain time interval tg2'. Subsequently, the trailing edge is provided to source voltage VS after a certain time interval ts2'. These trailing edges can prevent the erase time from increasing due to the trailing edges of the N well and P well. Moreover, the highest inter-band tunneling current is generated at the beginning of the erase. Therefore, when the erase proceeds to some extent, the inter-band tunneling voltage is not generated even if the N well potential and the P well potential are reduced. In this case, of course, the effect can be sufficiently obtained even if the trailing edge of N well voltage Vnw is provided after the trailing edge of source voltage VS or cell gate voltage VG.

Figure 7:
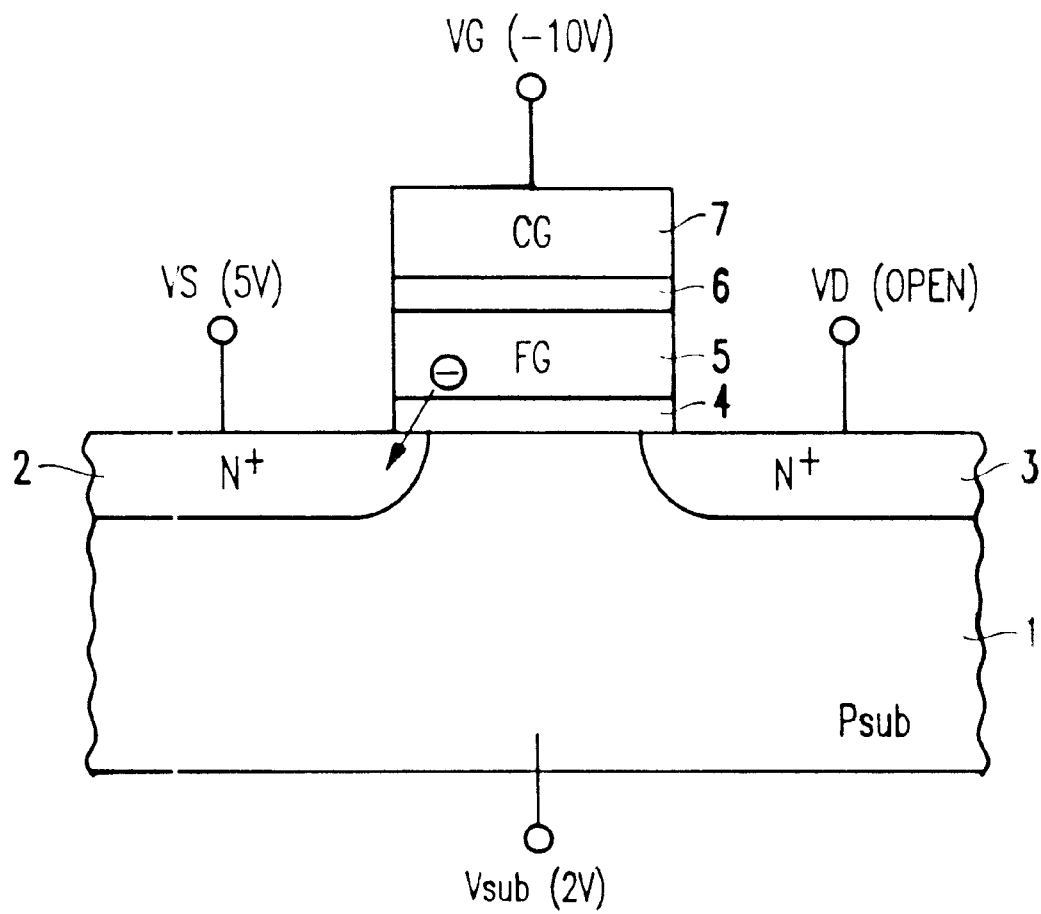

In the above-described embodiments, the present invention is applied to a semiconductor memory device in which the P-type semiconductor substrate has the N well and the P well and the N-type source and drain regions are formed in the P well. However, the present invention is also applicable to a semiconductor memory device in which the N well and the P well are not disposed and source diffusion layer 2 and drain diffusion layer 3 are formed on semiconductor substrate 1 as shown in FIG. 7. In this case, an intermediate potential between the ground potential and the source potential may be applied to semiconductor substrate 1. At this time, the timing of the application of the potential to semiconductor substrate 1 may be replaced by the timing of the application of the potential to the N well shown in FIGS. 5 and 6.

A detailed description is omitted, but the present invention may apply the potential at the timing described below. That is, a required potential is supplied to the P-type semiconductor substrate. Then, a required potential is supplied to the N-type source region. The above-mentioned potential is supplied to the N-type well after a certain time interval. Next, a required potential is supplied to the P-type well after a certain time interval. Further, a required potential is supplied to the control gate after a certain time interval.

In the aforementioned embodiments, the present invention is applied to a flash memory having an N-channel MOS structure. However, the present invention can be also similarly applied to a flash memory having a P-channel MOS structure. In this case, of course, the polarity of the voltage applied to the source, the gate and the N and P wells is reverse to the polarity of the applied voltage in the above-described embodiments.

As described above, according to the present invention, at the same time that a predetermined potential is applied to the source and the gate, the intermediate potential between the source potential and the ground potential is applied to the semiconductor substrate or the well. In this manner, the inter-band tunneling current can be reduced near the source diffusion layer. It is thus possible to prevent the deterioration of the gate oxide film under the floating gate due to a hot carrier generated by the inter-band tunneling current and to improve the reliability. For the purpose of reducing the inter-band tunneling current, the source diffusion layer does not need to be constituted of the graded junction in order to relax the electric field between the source-side diffusion layer and the substrate. Thus, the drain and source diffusion layers can be symmetrically designed, so that a fine cell is easily formed in the longitudinal direction of the channel.

Although the preferred embodiments of the present invention have been described in detail, it should be understood that various changes, substitutions and alternations can be made therein without departing from spirit and scope of the inventions as defined by the appended claims.

What is claimed is:

1. A method of erasing data in a nonvolatile semiconductor memory device having a second conductive type source region and a second conductive type drain region on a first conductive type semiconductor substrate, having a floating gate on said first conductive type semiconductor substrate between said source region and said drain region through a first insulating film, and having a control gate on said floating gate through a second insulating film, said method comprising:

providing a predetermined potential to said source region, said predetermined potential having one of a positive polarity and a negative polarity with respect to a ground potential;

providing a high potential to said control gate, the high potential having the other one of the positive polarity and the negative polarity with respect to the ground potential;

providing a potential intermediate between said ground potential and said predetermined potential to said first conductive type semiconductor substrate;

providing said predetermined potential to said source region after a certain time interval after providing said potential to said first conductive type semiconductor substrate; and providing said high potential to said control gate after a predetermined time interval.

2. The method according to claim 1, wherein said first conductive type is a P conductive type, said second conductive type is an N conductive type, said method comprising:

providing a positive potential higher than said ground potential to said source region;

providing a negative potential lower than said ground potential to said control gate; and providing a positive potential, which is higher than said ground potential and lower than the positive potential provided to said source region, to said semiconductor substrate.

3. A method of erasing data in a nonvolatile semiconductor memory device having a second conductive type well region on a first conductive type semiconductor substrate, having a first conductive type well region in said second conductive type well region, having a second conductive type source region and a second conductive type drain region in said first conductive type well region, having a floating gate on said first conductive type well region between said source region and said drain region through a first insulating film, and having a control gate on said floating gate through a second insulating film, said method comprising:

providing a predetermined potential to said source region, said predetermined potential having one of a positive polarity and a negative polarity with respect to a ground potential;

providing a high potential to said control gate, the high potential having the other one of the positive polarity and the negative polarity with respect to the ground potential;

providing said ground potential to said first conductive type semiconductor substrate; and providing a potential intermediate between said ground potential and said predetermined potential to said second conductive type well region and said first conductive type well region.

4. The method according to claim 3, wherein said first conductive type is a P conductive type, said second conductive type is an N conductive type, said method comprising:

providing a positive potential higher than said ground potential to said source region;

providing a negative potential lower than said ground potential to said control gate;

providing said ground potential to said semiconductor substrate; and providing a positive potential, which is higher than said ground potential and lower than the positive potential provided to said source region, to said P conductive type well region and said N conductive type well region.

5. The method according to claim 3, further comprising:

providing said potential to said second conductive type source region after a certain time interval after providing said ground potential to said first conductive type semiconductor substrate and providing said potential to said second conductive type well region;

providing said potential to said first conductive type well region after a certain time interval; and providing said potential to said control gate after a certain time interval.

6. The method according to claim 4, further comprising:

providing said potential to said second conductive type source region after a certain time interval after providing said positive potential to said second conductive type well region;

providing said positive potential to said first conductive type well region after a certain time interval after providing said potential to said second conductive type well region; and providing said negative potential to said control gate after a certain time interval after providing said positive potential to said first conductive type well region.

7. The method according to claim 3, further comprising:

providing said potential to said second conductive type source region after a certain time interval after providing said potential to said second conductive type well region;

providing said potential to said first conductive type well region after a certain time interval after providing said potential to said second conductive type well region; and providing said potential to said control gate after a certain time interval after providing said potential to said first conductive type well region.

8. The method according to claim 4, further comprising:

providing said positive potential to said second conductive type source region after a certain time interval after providing said positive potential to said second conductive type well region;

providing said positive potential to said first conductive type well region after a certain time interval after providing said positive potential to said first conductive type well region; and providing said negative potential to said control gate after a certain time interval after providing said positive potential to said first conductive type well region.

* * * * *